United States Patent
Park et al.

(10) Patent No.: US 9,278,857 B2
(45) Date of Patent: Mar. 8, 2016

(54) METHOD OF SURFACE TENSION CONTROL TO REDUCE TRAPPED GAS BUBBLES

(75) Inventors: Sang-Min Park, San Jose, CA (US); Nobuo Kurataka, Campbell, CA (US); Gennady Gauzner, San Jose, CA (US)

(73) Assignee: Seagate Technology Inc., Cupertino, CA (US)

( * ) Notice: Subject to any disclaimer, the term of this patent is extended or adjusted under 35 U.S.C. 154(b) by 613 days.

(21) Appl. No.: 13/362,972

(22) Filed: Jan. 31, 2012

(65) Prior Publication Data
US 2013/0196122 A1 Aug. 1, 2013

(51) Int. Cl.
*B82Y 40/00* (2011.01)
*G03F 7/00* (2006.01)
*B82Y 10/00* (2011.01)
*B05D 3/12* (2006.01)
*B05D 3/10* (2006.01)

(52) U.S. Cl.
CPC .................. *B82Y 40/00* (2013.01); *B82Y 10/00* (2013.01); *G03F 7/0002* (2013.01); *B05D 3/10* (2013.01); *B05D 3/12* (2013.01); *Y10T 428/24802* (2015.01)

(58) Field of Classification Search
CPC ............. B05D 3/10; B05D 3/12; B82Y 40/00
See application file for complete search history.

(56) References Cited

U.S. PATENT DOCUMENTS

| | | | |
|---|---|---|---|
| 2006/0131238 A1* | 6/2006 | Xu ................................ | 210/656 |
| 2006/0185546 A1 | 8/2006 | Biggs et al. | |
| 2008/0131623 A1* | 6/2008 | Zhang et al. ................... | 427/569 |
| 2008/0160129 A1* | 7/2008 | Resnick et al. ............... | 425/385 |
| 2008/0164638 A1* | 7/2008 | Zhang ........................... | 264/500 |
| 2009/0135518 A1* | 5/2009 | Weller et al. .................. | 360/110 |
| 2010/0155988 A1* | 6/2010 | Keil et al. ..................... | 264/219 |

FOREIGN PATENT DOCUMENTS

| | | |
|---|---|---|
| JP | 2009-262546 | 11/2009 |
| KR | 10-2006-0037688 | 5/2006 |
| KR | 10-0843342 | 6/2008 |
| KR | 10-2011-0120972 | 11/2011 |

OTHER PUBLICATIONS

Satoshi Wakamatsu; Approaches to rapid resist spreading on dispensing based UV-NIL; 2011 International Symposia on Lithography Extensions; Miami, Florida; Oct. 20, 2011.

* cited by examiner

Primary Examiner — James M Mellott

(57) ABSTRACT

The embodiments disclose a method of surface tension control to reduce trapped gas bubbles in an imprint including modifying chemistry aspects of interfacial surfaces of an imprint template and a substrate to modify surface tensions, differentiating the interfacial surface tensions to control interfacial flow rates of a pre-cured liquid resist and controlling pre-cured liquid resist interfacial flow rates to reduce trapping gas and prevent trapped gas bubble defects in cured imprinted resist.

20 Claims, 9 Drawing Sheets

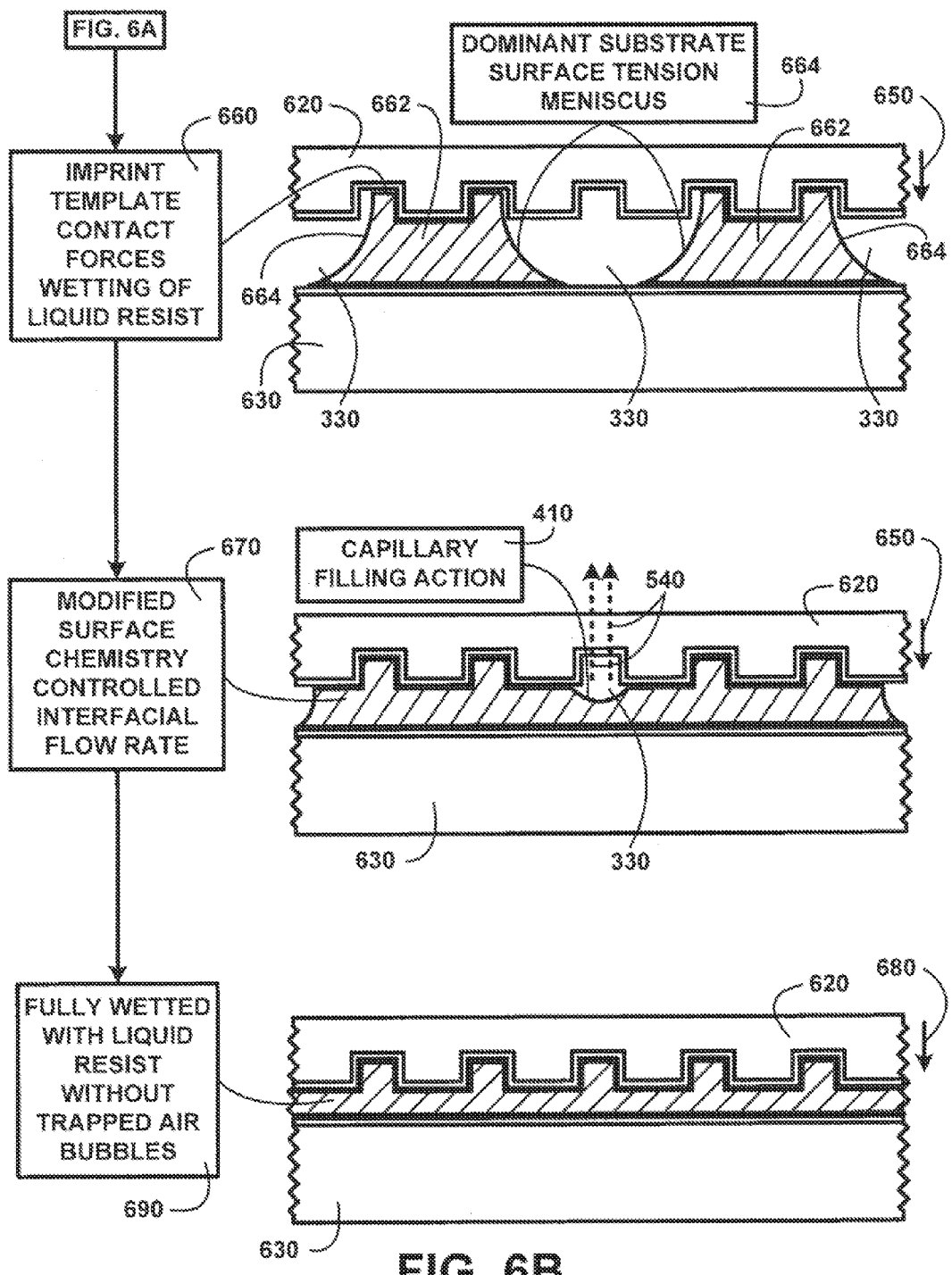

METHOD OF SURFACE TENSION CONTROL TO REDUCE TRAPPED GAS BUBBLES

BACKGROUND

Ultraviolet (UV) nano-imprint processes place an imprint template into a resist fluid deposited on a template substrate. The resist fluid fills the imprint template voids by capillary action. The flow of the fluid resist can trap gas in the imprint template void. The trapped gas creates bubbles in the UV cured resist creating void defects.

BRIEF DESCRIPTION OF THE DRAWINGS

FIG. 6B shows for illustrative purposes only an example of modified surface tension chemistry liquid resist wetting of one embodiment.

DETAILED DESCRIPTION OF THE INVENTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present invention.

General Overview:

It should be noted that the descriptions that follow, for example, in terms of a method of surface tension control to reduce trapped gas bubbles is described for illustrative purposes and the underlying system can apply to any number and multiple types of surface tension control processes, stack fabrication processes and stack designs. In one embodiment the method of surface tension control to reduce trapped gas bubbles can be configured using a modification of surface chemistry. The modification of surface chemistry can be configured to include decreasing the surface tension of an imprint template and can be configured to include relatively increasing the surface tension of a substrate using the present invention.

Figure 1:
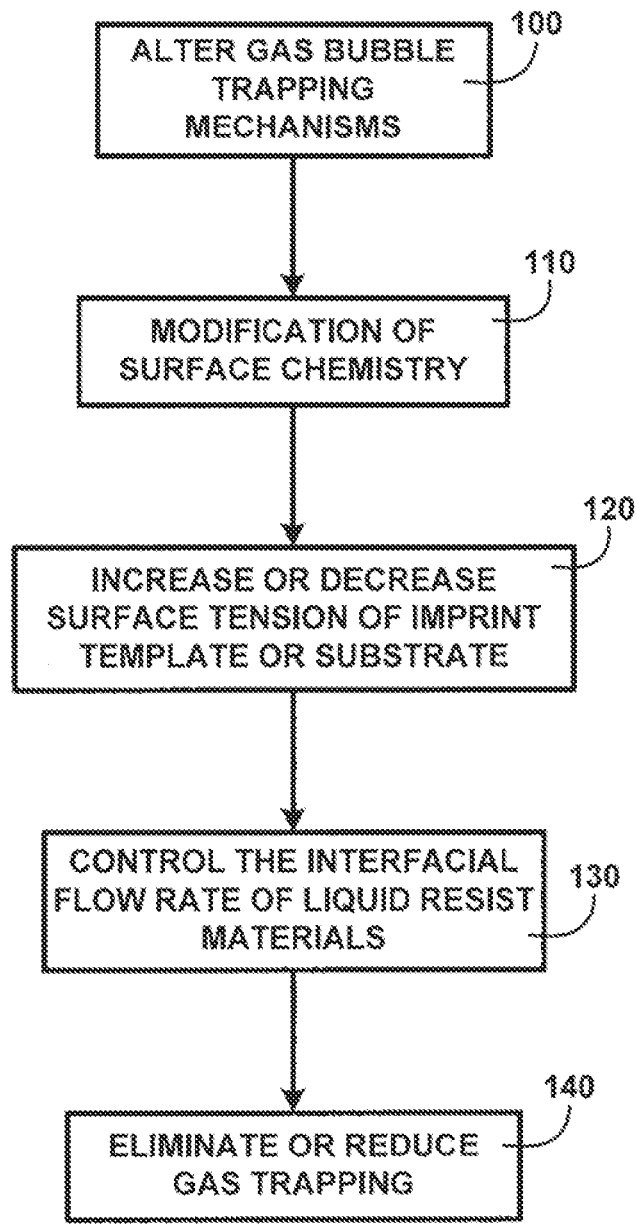
FIG. 1 shows a block diagram of an overview of a method of surface tension control to reduce trapped gas bubbles of one embodiment.

FIG. 1 shows a block diagram of an overview of a method of surface tension control to reduce trapped gas bubbles of one embodiment. FIG. 1 shows a method of surface tension control which can reduce or eliminate the formation of trapped gas bubbles in for example ultraviolet (UV) imprint processes. UV imprint processes are used in nano fabrication to transfer the topography of an imprint template to a substrate to for example create a master template or to fabricate stacks for example bit patterned media (BPM) of one embodiment.

UV imprint processes place an imprint template onto liquid resist materials deposited on the surface of the substrate. The resist materials are cured using exposure of ultraviolet UV light through the imprint template. The UV exposure of the resist materials for example hardens the liquid resist thereby retaining topography of the template of one embodiment.

The liquid resist materials are deposited onto the surface of the substrate for example in droplets. The droplets flow between the surfaces of the imprint template and substrate and merge. Capillary action fills the cavity or raised sections of the topography. The merging of the liquid resist droplets can trap gas in the resist. Trapped gas after curing becomes void defects of one embodiment.

Voids (trapped gas bubbles) interfere with other processes such as reactive ion etch (RIE) used in the processes to transfer the template patterns. These interferences caused by the void defects can lead to missing pattern sections and deformities in the patterns. The missing pattern sections and deformities negatively affect the quality of a master template and any stacks fabricated made using the master template of one embodiment.

The trapped gas bubbles are formed when merging of the liquid resist is uncontrolled. The flow rates of the liquid resist are governed by the surface tension due to the surface energy of the materials of the interface surfaces of the imprint template and substrate. The method of surface tension control to reduce trapped gas bubbles can alter gas bubble trapping mechanisms 100 of one embodiment.

The alteration of the mechanism of bubble trapping is achieved by modification of surface chemistry 110. The modification of surface chemistry 110 is performed to increase or decrease surface energy of imprint template or substrate 120 thereby controlling the levels of the surface tensions of both surfaces. The increase or decrease surface energy of imprint template or substrate 120 provides a method to control the interfacial flow rate of resist materials 130 of one embodiment.

The control the interfacial flow rate of resist materials 130 can eliminate or reduce gas trapping 140. The elimination or reduction of trapped gas bubbles prevents void defects from forming. The method of surface tension control to reduce trapped gas bubbles increases the quality of master templates and stacks such as bit patterned media (BPM) fabricated using UV imprint processes of one embodiment.

DETAILED DESCRIPTION

Figure 2:
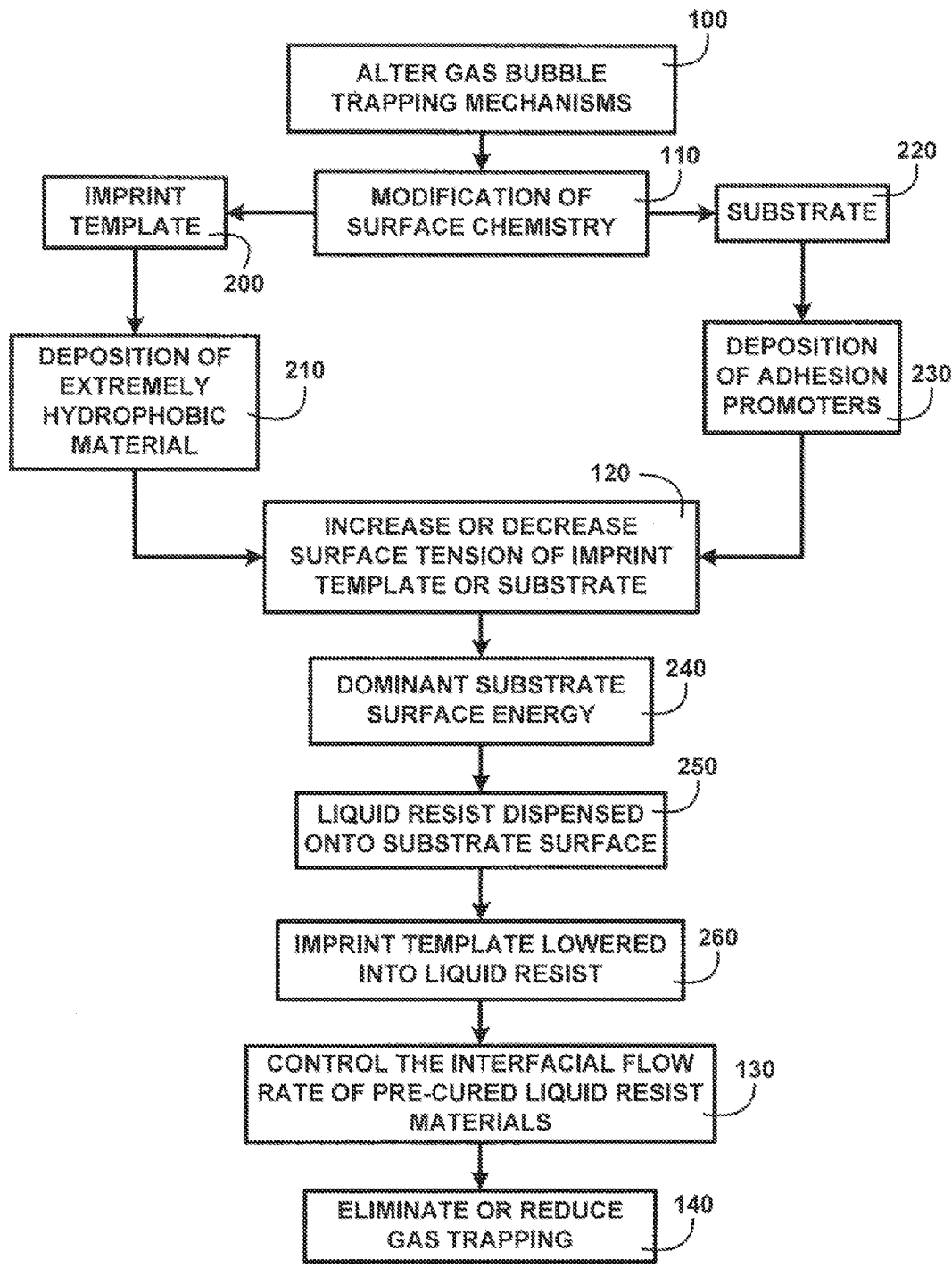
FIG. 2 shows a block diagram of an overview flow chart of a method of surface tension control to reduce trapped gas bubbles of one embodiment.

FIG. 2 shows a block diagram of an overview flow chart of a method of surface tension control to reduce trapped gas bubbles of one embodiment. FIG. 2 shows a method of surface tension control to alter gas bubble trapping mechanisms 100. The method of surface tension control to reduce trapped gas bubbles alters the mechanisms of bubble trapping in for example UV imprint processes by the modification of surface chemistry 110.

The surface chemistry of the materials used in the fabrication of imprint templates and substrates determines the amount of surface energy. The surface energy can accelerate or inhibit flow rates of the liquid resist materials used in the UV imprint process pattern transfer. Materials such as quartz are used in the fabrication of the imprint template. Quartz, glass and silicon are examples of materials used in fabricating substrates used in nano fabrication to create master templates and for fabrication of stacks such as bit patterned media (BPM). A substrate may further include layers deposited on top of the substrate for example a chromium (Cr) or amorphous carbon (a-C) image layer of one embodiment.

The flow of the liquid resist deposited on the surface of the substrate into the topography of the imprint template is the foundation of the UV imprint process to transfer patterns. The variety of materials used for both imprint templates and un-layered and layered substrates can cause uncontrolled flow rates to occur when the liquid resist materials are sandwiched between the two surfaces. Liquid resist is applied to the surface of the substrate in a deposition process for example dispensed by ink-jet nozzles in droplet form of one embodiment.

Uncontrolled liquid resist flow rates can lead to gas being trapped between merging droplets beneath the imprint template. The trapped gas bubbles are transformed into void defects when the resist is cured with exposure to UV light. The bubble voids inside the cured (hardened) resist can for example cause non-uniformity of the etch rate in a RIE process. This can cause sections of the designed patterns to be deformed or be missing all together of one embodiment.

The method of surface tension control to reduce trapped gas bubbles modification of surface chemistry 110 can increase or decrease surface energy of imprint template or substrate 120 surfaces that come into contact with the liquid resist. The modification of surface chemistry 110 can thusly control the interfacial flow rate of resist materials 130. The control of the flow rates of the interface opposing surfaces can eliminate or reduce gas trapping 140 and the void defects created by the trapped gas bubbles of one embodiment.

The surface chemistry of an imprint template 200 can be modified for example using a deposition of extremely hydrophobic material 210. The deposition of extremely hydrophobic material 210 can include for example fluoroalkylsilanes such as 1H,1H, 2H,2H-perfluorodecyltrichlorosilane (FDTS), 1H,1H,2H,2H-perfluorooctyltriethoxysilane and 1H,1H,2H,2H-perfluorooctyltrichlorosilane. The deposition of extremely hydrophobic material 210 can be performed using a vapor deposition process. The thickness of the vapor deposition can be controlled to not affect the imprint template pattern or the fabrication of the imprint template can be adjusted to adjust for the addition of the vapor deposit of one embodiment.

The un-layered and layered substrate 220 can be modified for example using a deposition of adhesion promoters 230. A substrate for example a quartz substrate has a hydrophilic surface on which liquid resist can flow easily. A deposit of adhesion promoters modifies the substrate to a hydrophobic surface to decrease the flow rate of a liquid resist. Adhesion promoters can include materials for example ValMat (Molecular Imprints) and mr-APS1 (Microresist Technology). The adhesion promoter materials can be deposited using processes for example a vapor deposition or a spun application to enhance adhesion force between the substrate 220 and cured resist of one embodiment.

The increase or decrease surface energy of imprint template or substrate 120 surfaces can be applied to one or both interface surfaces. A liquid such as water is a relatively high surface energy material and flows at a fast rate when in contact with a higher energy surface (hydrophilic surface). Water when in contact with a material that has a lower surface energy (hydrophobic surface) may for example bead up due to a very low flow rate of one embodiment.

When for example the liquid resist flow rate against the imprint template 200 interface surfaces is dominant or faster than the liquid resist flow rate against the substrate 220 interface surface it is easy to capture or trap gas bubbles and form void defects after the UV curing process. The modification of surface chemistry 110 in this example would decrease the surface energy of the imprint template 200 interface surfaces using for example a deposition of extremely hydrophobic material 210. This modification of surface chemistry 110 then shifts the dominance in flow rates to the substrate 220 surfaces. The resulting increase in the wetting or flow rate of the liquid resist on the substrate 220 surfaces to be greater than that of the imprint template 200 results in fewer chances to trap gas in the inner part of resist layer of one embodiment.

The modification of surface chemistry 110 creates a dominant substrate surface energy 240. The UV imprint process continues with a liquid resist dispensed onto substrate surface 250. An imprint template lowered into liquid resist 260 with the modified increased surface energy begins to control the interfacial flow rate of resist materials 130. The dominant substrate surface energy 240 produces controlled flow rates that eliminate or reduce gas trapping 140. The method of surface tension control to reduce trapped gas bubbles thereby prevents formation of trapped gas bubbles that create void defects which negatively affect the quality of the UV imprint pattern transfer processes of one embodiment.

Figure 3A:
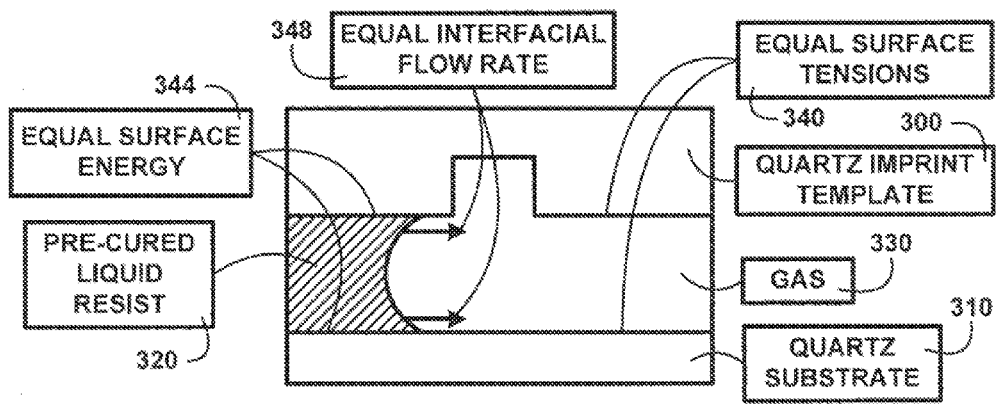
FIG. 3A shows for illustrative purposes only an example of surface tension interfacial flow rate effect of one embodiment.

Surface Tension Interfacial Flow Rate Effect:

FIG. 3A shows for illustrative purposes only an example of surface tension interfacial flow rate effect of one embodiment. FIG. 3A shows a process in which an quartz imprint template 300 is placed on top of a pre-cured liquid resist 320 that has been deposited on top of a quartz substrate 310 for example in droplets. The clean environment used in the process may include a gas 330 such as helium. The quartz imprint template 300 can be fabricated using materials such as quartz or silicon. The quartz substrate 310 can be fabricated using materials such as quartz, glass or silicon as well. The exposed surface materials would be characterized by having equal surface energy 344 levels leading to equal surface tensions 340 when the quartz imprint template 300 and quartz substrate 310 are made of the same materials. This would cause the pre-cured liquid resist 320 to have an equal interfacial flow rate 348 along the two surfaces of one embodiment.

The quartz substrate 310 can also be fabricated with multiple layers being deposited on top of the quartz substrate 310 surface such as an image layer using for example amorphous carbon (a-C) or Chromium (Cr). An adhesion layer can for example be deposited on top of the image layer to better adhere the resist materials to the substrate structure. Different materials carry various levels of surface energy. The effect of the different surface energy levels causes different surface tensions and the pre-cured liquid resist 320 to have different flow rates along the two unlike surfaces. Different pre-cured liquid resist 320 flow rates can cause the trapping of the gas 330 between merging droplets of the pre-cured liquid resist 320 of one embodiment.

Figure 3B:
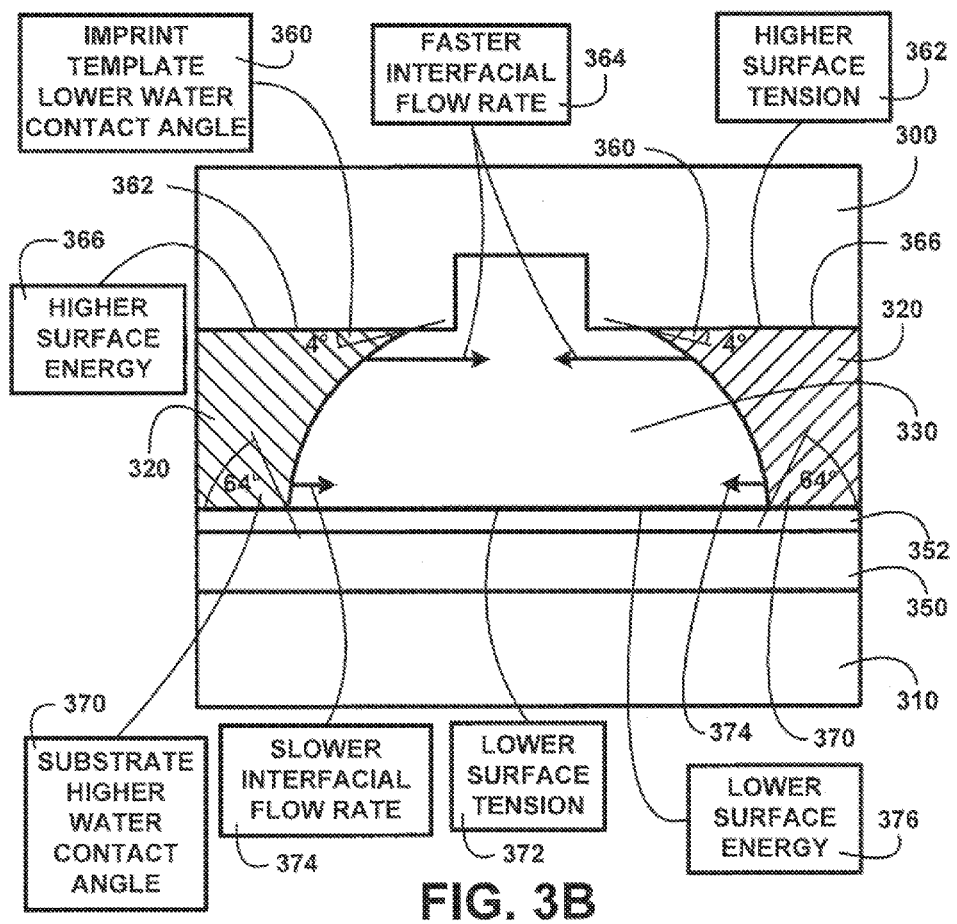
FIG. 3B shows for illustrative purposes only an example of dominant imprint template water contact angles of one embodiment.

Dominant Imprint Template Water Contact Angles:

FIG. 3B shows for illustrative purposes only an example of dominant imprint template water contact angles of one embodiment. FIG. 3B shows the quartz imprint template 300 and the opposing quartz substrate 310. Between the opposing structures is gas 330 for example helium used in the clean fabrication environment. In one embodiment on top of the quartz substrate 310 is deposited an image layer 350 and a hydrophobic adhesion layer 352. The hydrophobic adhesion layer 352 can be deposited to better adhere a pre-cured liquid resist 320 to the substrate structure. The pre-cured liquid resist 320 can for example be deposited on the surface of the substrate structure. After resist deposition the quartz imprint template 300 is lowered into the pre-cured liquid resist 320 causing the spreading or wetting of the liquid resist materials between the interfaces of the two opposing surfaces of one embodiment.

The quartz imprint template 300 presents a hydrophilic surface contact for the pre-cured liquid resist 320. The hydrophilic surface of the quartz forms an imprint template lower water contact angle 360 of for example 4° (degrees). The hydrophilic surface with the lower water contact angle has a higher surface energy 366 creating a higher surface tension 362 which leads to a faster interfacial flow rate 364 of the pre-cured liquid resist 320 of one embodiment.

The hydrophobic adhesion layer 352 material deposited on the quartz substrate 310 modifies the surface to a hydrophobic surface contact for the pre-cured liquid resist 320. The hydrophobic surface of the hydrophobic adhesion layer 352 material creates a substrate structure higher water contact angle 370 of for example 64° (degrees). The hydrophobic surface with the higher water contact angle has a lower surface energy 376 creating a lower surface tension 372 which leads to a slower interfacial flow rate 374 of the pre-cured liquid resist 320 of one embodiment.

Figure 4A:
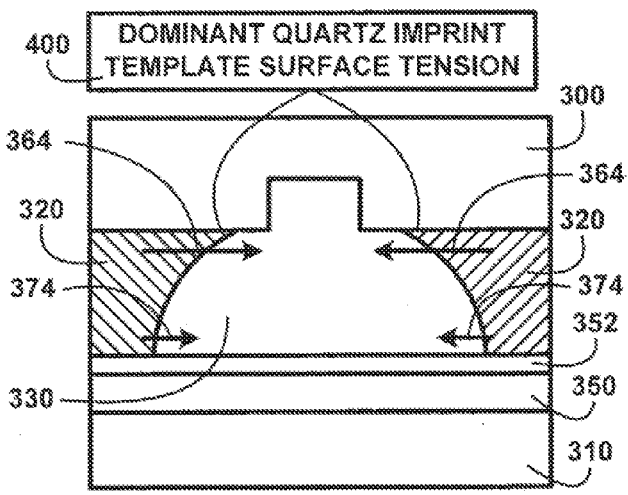
FIG. 4A shows for illustrative purposes only an example of a mechanism of bubble trapping of one embodiment.

Mechanism of Bubble Trapping:

FIG. 4A shows for illustrative purposes only an example of a mechanism of bubble trapping of one embodiment. FIG. 4A shows the quartz imprint template 300 and the quartz substrate 310 structure with the image layer 350 and the hydrophobic adhesion layer 352. The pre-cured liquid resist 320 has been deposited in droplets on the hydrophobic adhesion layer 352 of the quartz substrate 310 structure and the quartz imprint template 300 lowered into the pre-cured liquid resist 320. The gas 330 is seen between the two merging droplets of liquid resist of one embodiment.

A dominant quartz imprint template surface tension 400 due to the nature of the different surface materials causes a faster interfacial flow rate 364 along the surface of the quartz imprint template 300. A slower interfacial flow rate 374 of the pre-cured liquid resist 320 occurs along the surface of the hydrophobic adhesion layer 352 of one embodiment.

Figure 4B:
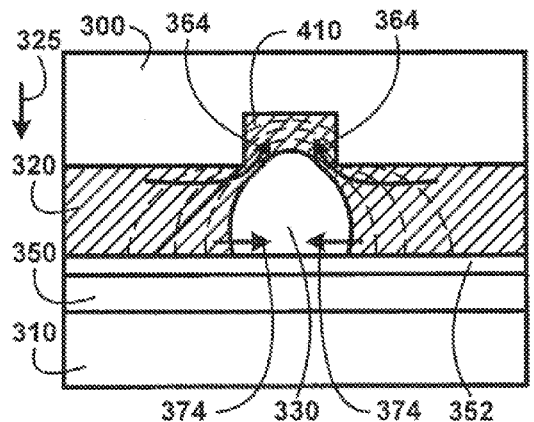
FIG. 4B shows for illustrative purposes only an example of dominant imprint template surface tension of one embodiment.

Dominant Imprint Template Surface Tension:

FIG. 4B shows for illustrative purposes only an example of dominant imprint template surface tension of one embodiment. FIG. 4B shows the quartz imprint template 300 and the quartz substrate 310 structure. The quartz substrate 310 structure can include the image layer 350 and hydrophobic adhesion layer 352. The spreading of the pre-cured liquid resist 320 droplets increases as the quartz imprint template 300 is lowered 325 further into the pre-cured liquid resist 320. A capillary filling action 410 is triggered as the pre-cured liquid resist 320 reaches the cavity area of the raised template topography. The dominant faster interfacial flow rate 364 along the imprint template lower surface tension 362 of FIG. 3B fills the cavity area of the raised template topography. The gas 330 below is cut off from venting along the raised template topography cavity. The slower interfacial flow rate 374 along the surface of the hydrophobic adhesion layer 352 leaves open the void filled with the gas 330 of one embodiment.

Figure 4D:
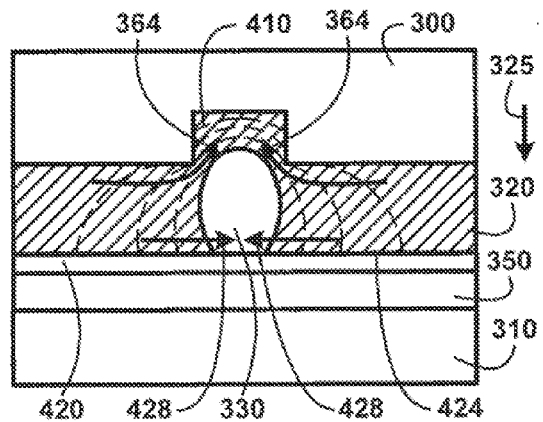
FIG. 4D shows for illustrative purposes only an example of a substrate reduced hydrophobic surface of one embodiment.
Figure 4C:
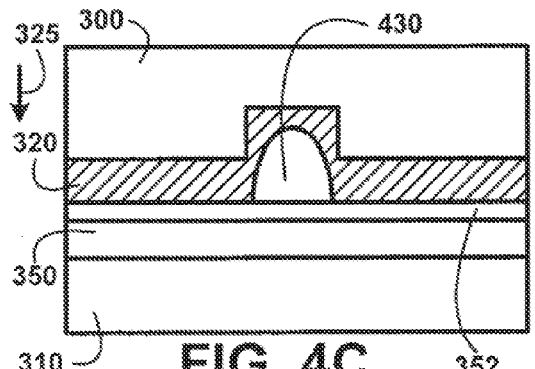
FIG. 4C shows for illustrative purposes only an example of a trapped gas bubble of one embodiment.

Trapped Gas Bubble:

FIG. 4C shows for illustrative purposes only an example of a trapped gas bubble of one embodiment. FIG. 4C shows the quartz imprint template 300 lowered 325 further into the pre-cured liquid resist 320 towards the quartz substrate 310, image layer 350 and surface of the hydrophobic adhesion layer 352. The capillary filling action 410 of FIG. 4B filling the cavity area of the raised template topography has prevented the venting of the gas 330 of FIG. 3A. This creates a trapped gas bubble 430 that may be in contact with the hydrophobic adhesion layer 352 surface of one embodiment.

Substrate Reduced Hydrophobic Surface:

FIG. 4D shows for illustrative purposes only an example of a substrate reduced hydrophobic surface of one embodiment. FIG. 4D shows the quartz imprint template 300 lowered 325 further into the pre-cured liquid resist 320. The faster interfacial flow rate 364 occurs along the surface of the quartz imprint template 300 as the pre-cured liquid resist 320 droplets merge closer together. The capillary filling action 410 fills the cavity of the imprint template topography of one embodiment.

In one embodiment an adhesion layer 420 has been deposited on top of the image layer 350 on the quartz substrate 310. The adhesion layer 420 is less hydrophobic than the hydrophobic adhesion layer 352 of FIG. 3B creating an increased substrate surface tension 424. The increased substrate surface tension 424 causes an increased interfacial flow rate 428 of the pre-cured liquid resist 320 along the surface of the adhesion layer 420. The increased interfacial flow rate 428 begins to close the merging droplets underneath the gas 330 of one embodiment.

Figure 4E:
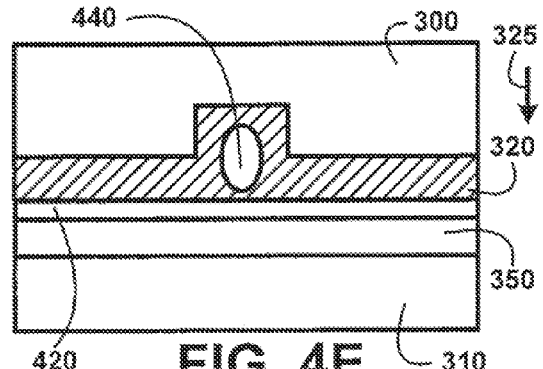
FIG. 4E shows for illustrative purposes only an example of a suspended trapped gas bubble of one embodiment.

Suspended Trapped Gas Bubble:

FIG. 4E shows for illustrative purposes only an example of a suspended trapped gas bubble of one embodiment. FIG. 4E shows the final positioning of the quartz imprint template 300 as it is lowered 325 further into the pre-cured liquid resist 320. The adhesion layer 420 on top of the image layer 350 and quartz substrate 310 has completely closed the merged droplets of the pre-cured liquid resist 320 underneath the gas 330 of FIG. 3A. The gas could not vent through the cavity of the template topography and has formed a suspended trapped gas bubble 440 of one embodiment.

Figure 5A:
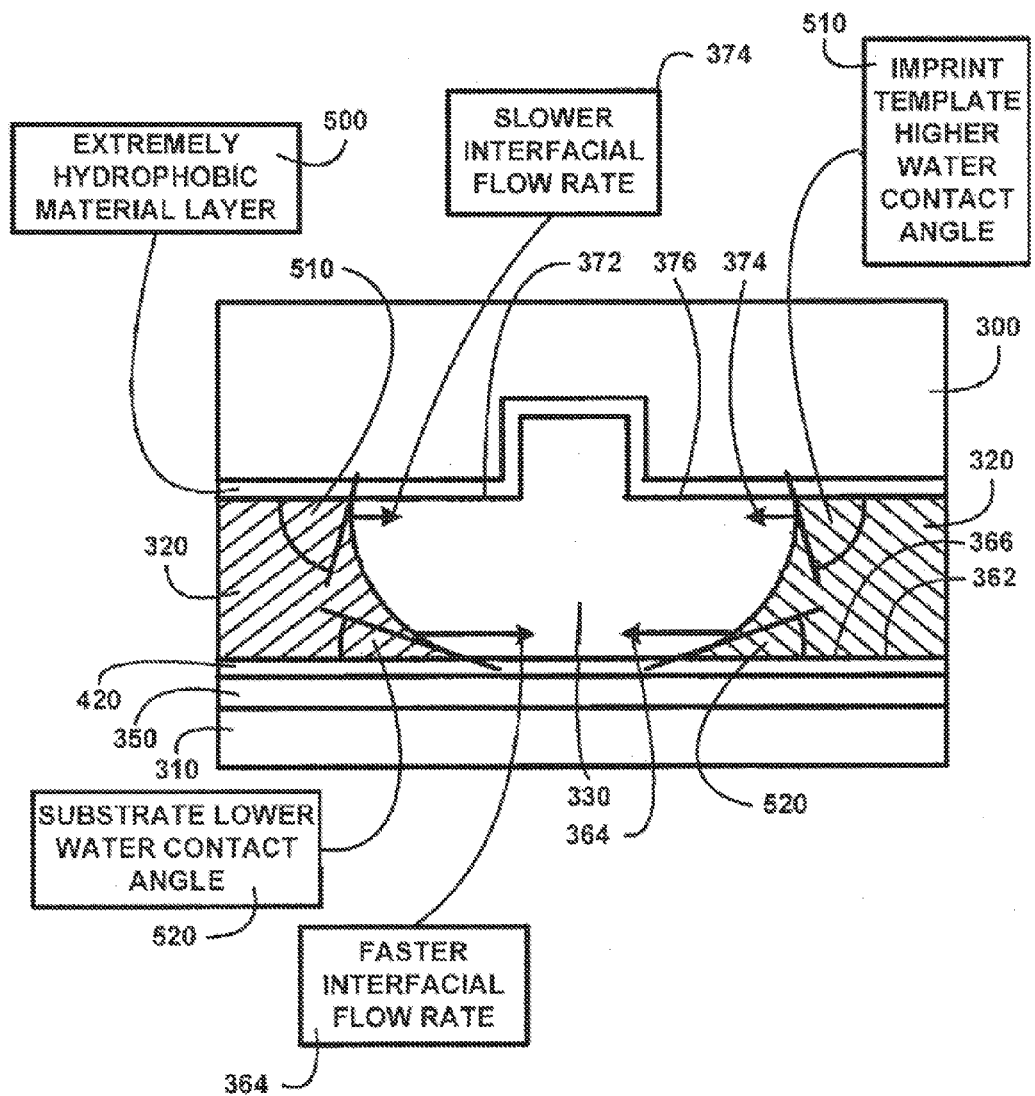
FIG. 5A shows for illustrative purposes only an example of a controlled increase of imprint template surface tension of one embodiment.

Controlled Increase of Imprint Template Surface Tension:

FIG. 5A shows for illustrative purposes only an example of a controlled increase of imprint template surface tension of one embodiment. FIG. 5A shows the quartz imprint template 300 on to which an extremely hydrophobic material layer 500 has been deposited. The extremely hydrophobic material layer 500 can include for example materials such as fluoroalkylsilanes (FDTS) deposited for example by vapor or wet deposition. The extremely hydrophobic material layer 500 material presents an extremely hydrophobic surface interfacial contact for the pre-cured liquid resist 320 of one embodiment.

The extremely hydrophobic material layer 500 creates an imprint template higher water contact angle 510 of for example 111° (degrees). The extremely hydrophobic surface with the higher water contact angle has a much lower surface energy 376 creating a much lower surface tension 372. The lower surface tension 372 leads to a slower interfacial flow rate 374 of the pre-cured liquid resist 320 of one embodiment.

The quartz substrate 310 has deposited on it the image layer 350 and the adhesion layer 420. The hydrophobic surface of the adhesion layer 420 material forms a substrate water contact angle 520 of for example 64° (degrees) lower than the imprint template higher water contact angle 510. The substrate lower water contact angle 520 in relationship to the imprint template higher water contact angle 510 creates a relatively higher surface energy 366 and accompanying relatively higher surface tension 362 on the surface of the adhesion layer 420. The differential in surface tensions creates the relatively faster interfacial flow rate 364 of the pre-cured liquid resist 320 along the adhesion layer 420 surface. The controlled decrease of imprint template surface tension lessens the chances of trapping gas 330 and forming trapped gas bubbles in the pre-cured liquid resist 320 of one embodiment.

Figure 5B:
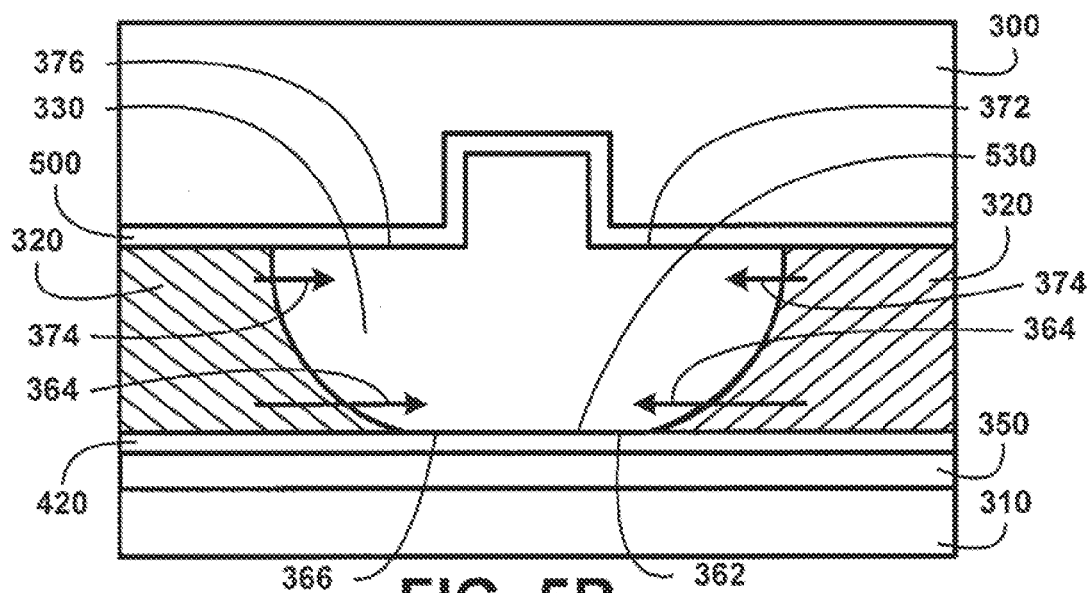
FIG. 5B shows for illustrative purposes only an example of a controlled dominance of substrate surface tension of one embodiment.

Controlled Dominance of Substrate Surface Tension:

FIG. 5B shows for illustrative purposes only an example of a controlled dominance of substrate surface tension of one embodiment. FIG. 5B shows a controlled dominance of substrate surface tension due to the controlled deposition of the extremely hydrophobic material layer 500 on the quartz imprint template 300. The quartz substrate 310 structure with the image layer 350 and the adhesion layer 420 maintains its surface tension and accompanying flow rate. The extremely hydrophobic material layer 500 has a lower surface energy 376 and resulting lower surface tension 372 of one embodiment.

The lower surface tension 372 produces a slower interfacial flow rate 374 of the pre-cured liquid resist 320 along the surface of the extremely hydrophobic material layer 500. Relative to the decreased surface tension of the extremely hydrophobic material layer 500, the adhesion layer 420 has the relatively higher surface energy 366 and higher surface tension 362 resulting in the faster interfacial flow rate 364. The faster interfacial flow rate 364 of the pre-cured liquid resist 320 along the surface of the adhesion layer 420 forces the small gas 330 molecules (the kinetic diameter of He is 0.256 nm) to penetrate through the pores (about 0.3 nm diameter) of the quartz template. A dominant substrate surface tension 530 controls the flow rate of the pre-cured liquid resist 320 in a manner that prevents the trapping of gas of one embodiment.

Figure 5C:
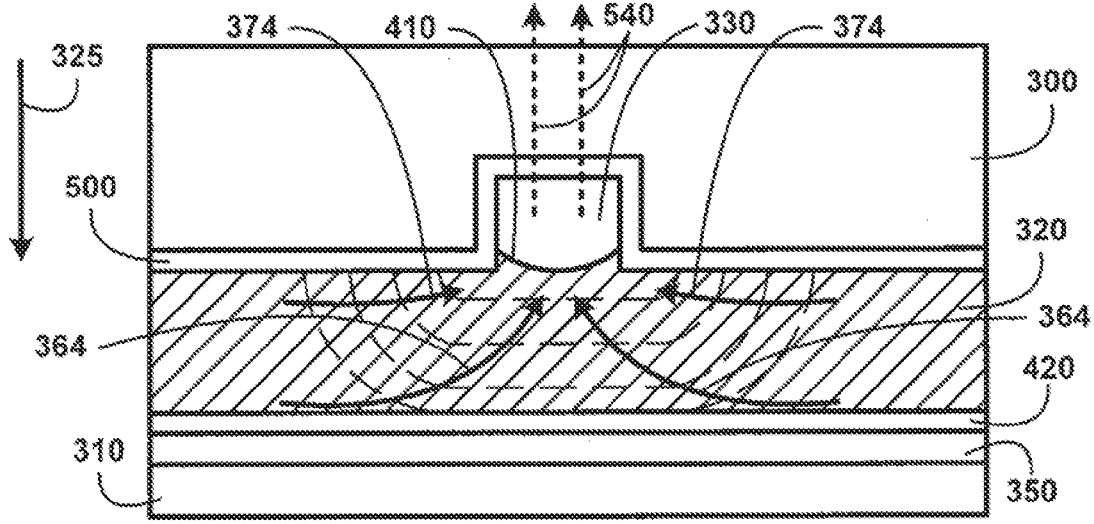
FIG. 5C shows for illustrative purposes only an example of a controlled pre-cured liquid resist wetting of one embodiment.

Controlled Pre-Cured Liquid Resist Wetting:

FIG. 5C shows for illustrative purposes only an example of a controlled pre-cured liquid resist wetting of one embodiment. FIG. 5C shows the controlled pre-cured liquid resist wetting that occurs as the quartz imprint template 300 coated with the extremely hydrophobic material layer 500 is lowered 325 further into the pre-cured liquid resist 320. The slower interfacial flow rate 374 along the surface of the extremely hydrophobic material layer 500 prevents the pre-cured liquid resist 320 from reaching the cavity of the raised template topography before the liquid resist fills from below of one embodiment.

The faster interfacial flow rate 364 along the surface of the adhesion layer 420 merges the droplets of pre-cured liquid resist 320 above the quartz substrate 310 and image layer 350. The filling of the interface from the bottom up forces the gas 330 towards the cavity for venting 540. The capillary filling action 410 begins to fill the cavity as the pre-cured liquid resist 320 flowing from the bottom and along the surface of the extremely hydrophobic material layer 500 reach the cavity of one embodiment.

Figure 5D:
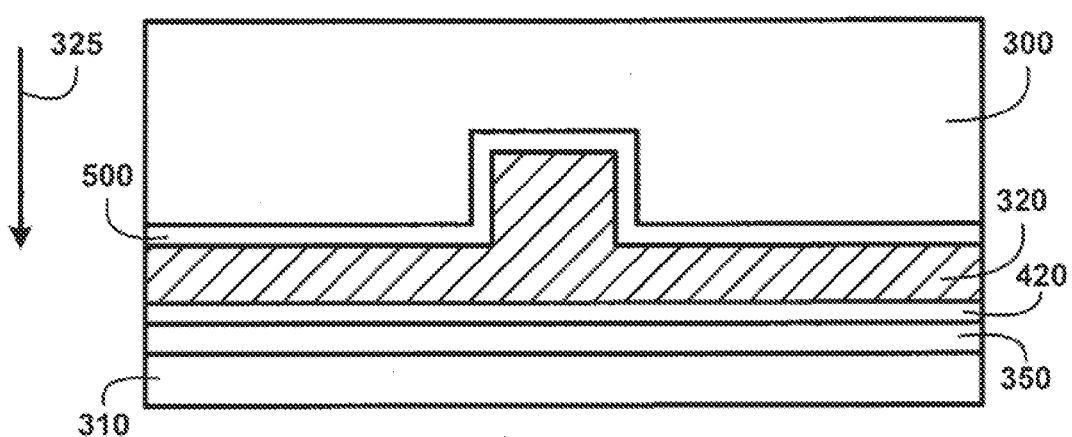
FIG. 5D shows for illustrative purposes only an example of a of a controlled liquid resist filling of template topography of one embodiment.

Controlled Liquid Resist Filling of Template Topography:

FIG. 5D shows for illustrative purposes only an example of a controlled liquid resist filling of template topography of one embodiment. FIG. 5D shows the quartz imprint template 300 and deposited extremely hydrophobic material layer 500 as they are lowered 325 further into the pre-cured liquid resist 320 to the final position. The layered quartz substrate 310 including the image layer 350 and the adhesion layer 420 has a continuous coating of the pre-cured liquid resist 320. The surfaces of the extremely hydrophobic material layer 500 also have a continuous coating of the pre-cured liquid resist 320 of one embodiment.

The dominant substrate surface tension 530 of FIG. 5B created with the method of surface tension control to reduce trapped gas bubbles has prevented any trapping of the gas 330 of FIG. 3A. The controlled liquid resist filling of template topography prevents trapping gas bubbles and the formation of void defects in the cured resist materials and thereby increases the quality of stacks such as bit-patterned media (BPM) fabricated using a UV imprint process of one embodiment.

Figure 6A:
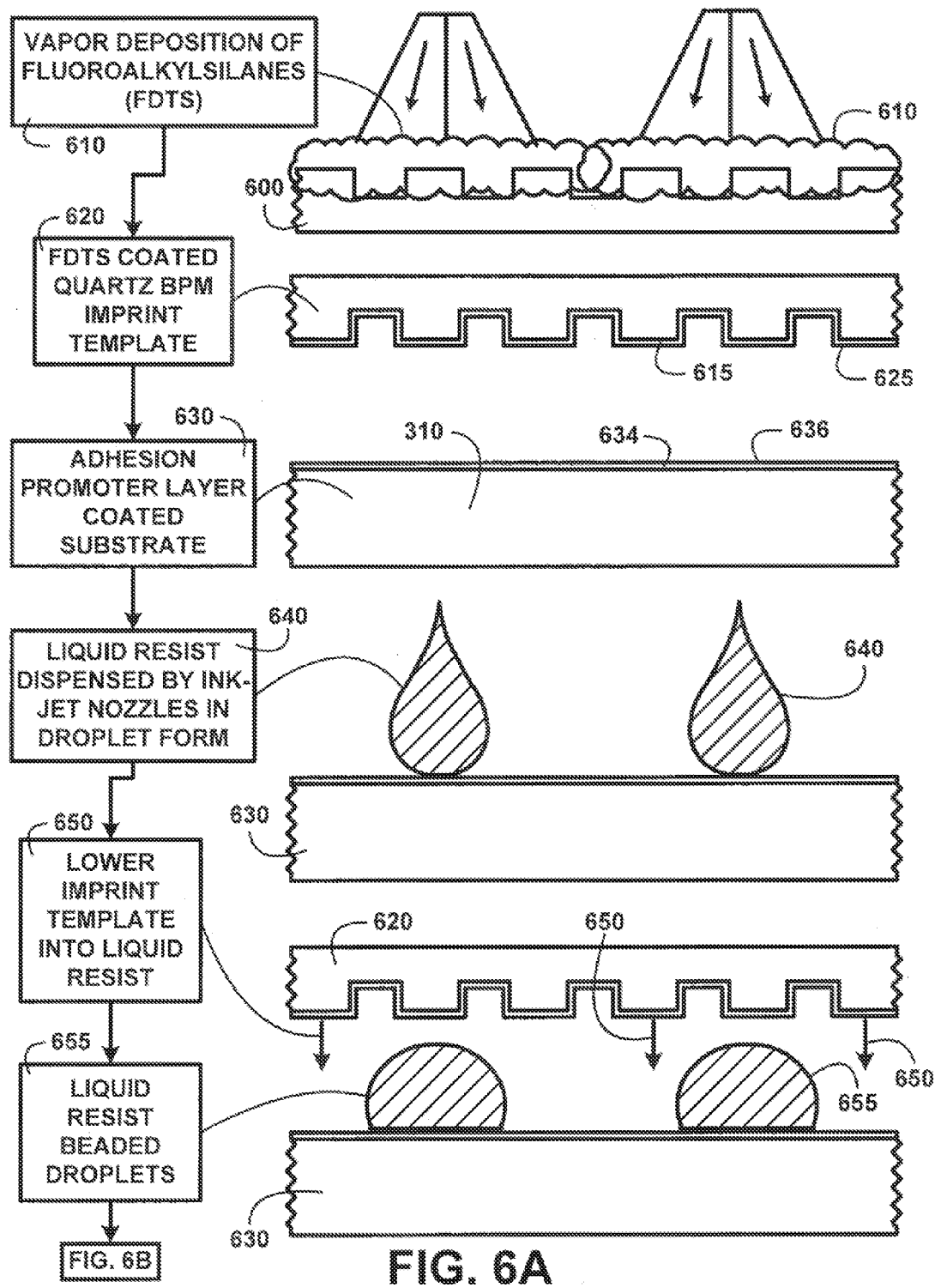
FIG. 6A shows for illustrative purposes only an example of surface tension modification process of one embodiment.

Surface Tension Modification Process:

FIG. 6A shows for illustrative purposes only an example of surface tension modification process of one embodiment. FIG. 6A shows one embodiment of the processes for the modification of surface chemistry 110 of FIG. 1 in a UV imprint process. In this embodiment the process starts with a (bit-patterned media) BPM quartz imprint template 600. Onto the BPM quartz imprint template 600 is a vapor deposition of fluoroalkylsilanes (FDTS) 610.

The extremely hydrophobic material layer 500 of FIG. 5A can include extremely hydrophobic materials such as fluoroalkylsilanes in compounds such as 1H,1H,2H,2H-perfluorodecyltrichlorosilane (FDTS), 1H,1H,2H,2H-perfluorooctyltriethoxysilane and 1H,1H,2H,2H-perfluorooctyltrichlorosilane. The vapor or wet deposition of fluoroalkylsilanes (FDTS) 610 creates mono or multi-layers of fluoroalkylsilanes (FDTS) layer 615. The fluoroalkylsilanes (FDTS) layer 615 creates a lower modified surface tension 625 on the FDTS coated quartz BPM imprint template 620 of one embodiment.

The quartz substrate 310 is coated with an adhesion promoter layer 634. The adhesion promoter layer 634 creates a higher modified surface tension 636 relative to the fluoroalkylsilanes (FDTS) layer 615. An adhesion promoter layer coated substrate 630 can include an adhesion promoter such as ValMat (Molecular Imprints) and Mr-APS1 (Microresist Technology). An adhesion promoter layer coated substrate 630 may be used for example in a direct etch transfer of the cured resist pattern of one embodiment.

The next step is to include for example pre-cured liquid resist dispensed by ink-jet nozzles in droplet form 640 on the adhesion promoter layer coated substrate 630. The following step is to lower imprint template into liquid resist 650. The FDTS coated quartz BPM imprint template 620 settles into the liquid resist beaded droplets 655 on the adhesion promoter layer coated substrate 630. The processes continue on FIG. 6B of one embodiment.

Modified Surface Tension Chemistry Liquid Resist Wetting:

FIG. 6B shows for illustrative purposes only an example of modified surface tension chemistry liquid resist wetting of one embodiment. FIG. 6B shows the continuation of processes from one embodiment described in FIG. 6A. FIG. 6B shows the pre-cured liquid resist 320 of FIG. 3A wetting results produced by the modification of surface chemistry 110 of FIG. 1 during the UV imprint process of one embodiment.

The lower imprint template into liquid resist 650 action produces imprint template contact forces wetting of liquid resist 660. The lower surface tension of the modified FDTS coated quartz template 620 slows the spread of the liquid resist on these surfaces. This liquid resist initial interface wetting 662 has a much faster flow rate of spreading or wetting on the surfaces of an adhesion promoter layer coated substrate 630. A dominant substrate surface tension meniscus 664 illustrates the more rapid wetting along the bottom surfaces of the interface of one embodiment.

A modified surface chemistry controlled interfacial flow rate 670 promotes the capillary filling action 410. The capillary filling action 410 of the cavities of the imprint template occurs from the bottom up as the action continues to lower imprint template into liquid resist 650. The relative increased or accelerated flow rate created by the adhesion promoter layer coated substrate 630 causes the droplets to complete the lateral merging of the pre-cured liquid resist. The decrease or retardation of the flow rate caused by the FDTS coated quartz template 620 permits gas 330 venting 540 by penetrating through the pores of the quartz template of one embodiment.

An imprint template lowered to final position 680 terminates the interfacing movements. The FDTS coated quartz template 620 and adhesion promoter layer coated substrate 630 surfaces and interface interior are fully wetted with liquid resist without trapped air bubbles 690. The surface tension control achieves the full wetting of the pre-cured liquid resist without creating potential voids due to trapped gas bubbles. The UV imprint processes can continue beyond this step to cure the resist and transfer the BPM pattern into the substrate without void defects of one embodiment.

Figure 7A:
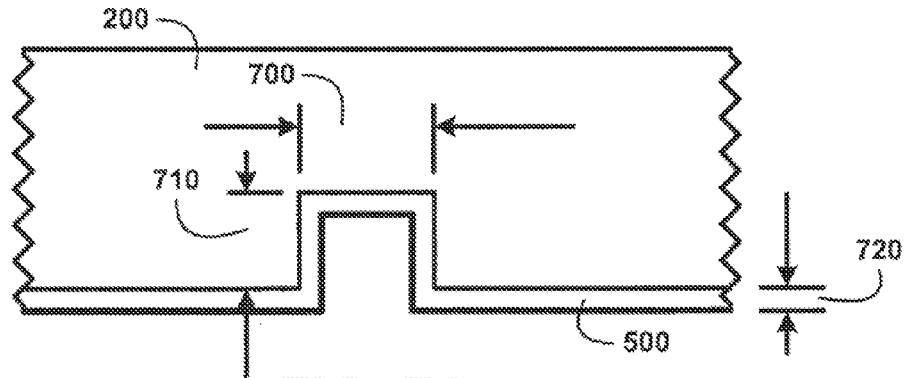
FIG. 7A shows for illustrative purposes only an example of surface tension control imprint template design adjustments of one embodiment.

Surface Tension Control Imprint Template Design Adjustments:

FIG. 7A shows for illustrative purposes only an example of surface tension control imprint template design adjustments of one embodiment. FIG. 7A shows the imprint template 200 with for example the design cavity width 700 dimensions and the cavity height 710 dimensions. The deposition of the extremely hydrophobic material layer 500 used to modify the chemistry of the imprint template 200 surfaces adds an extremely hydrophobic material layer thickness 720. The nano fabrication architecture deals for example in units of nanometers (nm). The vapor disposition of the addition of an extremely hydrophobic material may add a thickness ranging from a few nm to for example 100 nm of one embodiment.

The materials selected for the imprint template 200, extremely hydrophobic material layer 500, substrate 220 of FIG. 2, adhesion layer 352 of FIG. 3B and pre-cured liquid resist 320 of FIG. 3A can vary. The thickness or volume of the materials may vary as well. For example the pre-cured liquid resist 320 of FIG. 3A may be dispensed in thicknesses of 110 nm, 70 nm, 50 nm, and 35 nm. The flow rate of pre-cured liquid resist 320 of FIG. 3A material with the same viscosity may be affected by the dispensed volume of one embodiment.

The modification of the surface chemistry 110 of FIG. 1 materials selected and the disposition thicknesses are adjusted to accommodate the variations. Therefore the surface tension control added thicknesses may distort the design dimensions of the imprint template 200. Adjustments in the imprint template design dimensions made for the surface tension control added thicknesses achieve the original dimensions post depositions of one embodiment.

Figure 7B:
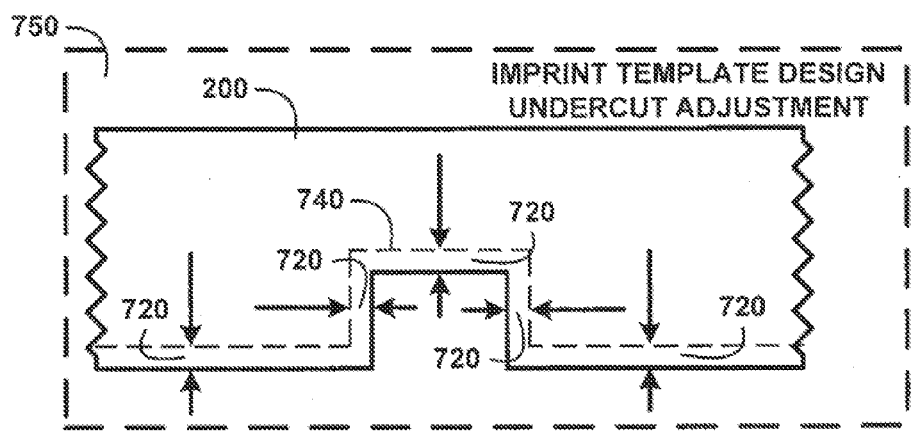
FIG. 7B shows for illustrative purposes only an example of surface tension modification imprint template undercut of one embodiment.

Surface Tension Modification Imprint Template Undercut:

FIG. 7B shows for illustrative purposes only an example of surface tension modification imprint template undercut of one embodiment. FIG. 7B shows an imprint template design undercut adjustment 750 being made to the imprint template 200 topography design dimensions. The topography is undercut by the extremely hydrophobic material layer thickness 720 dimension. An adjustment is made to for example the design cavity width 700 of FIG. 7A dimensions and the cavity height 710 of FIG. 7A dimensions using an imprint template undercut depth 740. The adjustments in the imprint template design are then used in the etching of the imprint template topography when it is created of one embodiment.

Figure 7C:
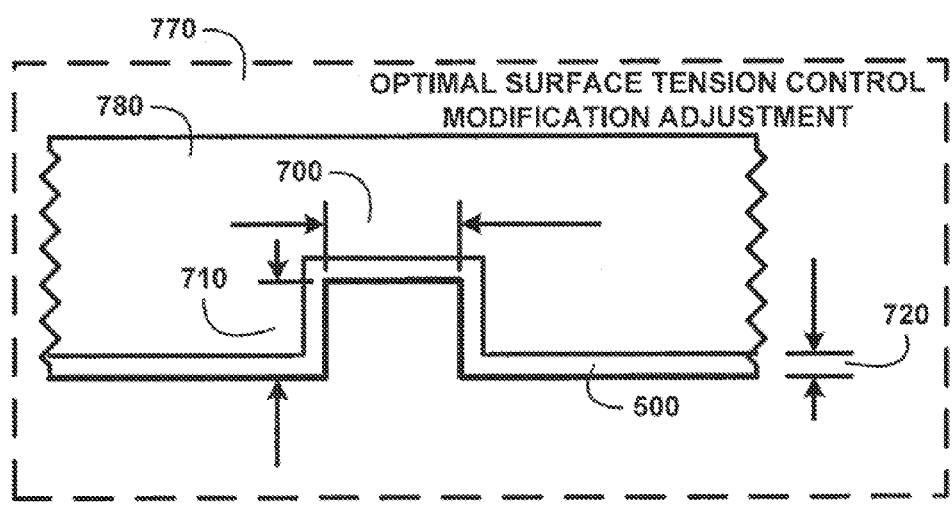
FIG. 7C shows for illustrative purposes only an example of an optimal surface tension control modification adjustment of one embodiment.

FIG. 7C shows for illustrative purposes only an example of an optimal surface tension control modification adjustment of one embodiment. FIG. 7C shows an undercut adjusted imprint template 780 created using an optimal surface tension control modification adjustment 770. The undercut adjusted imprint template 780 after the extremely hydrophobic material layer 500 is deposited maintains the same cavity width 700 dimensions and cavity height 710 dimensions of the original imprint template design. The original imprint template design dimensions can be achieved by adjusting for the extremely hydrophobic material layer thickness 720 of one embodiment.

The optimal surface tension control modification adjustment 770 accommodates the control achieved using the modification of surface chemistry 110 of FIG. 1 without changing the dimensions of the original imprint template design. The modifications to increase or decrease surface tension of imprint template or substrate 120 and faithful transfer of the imprint template pattern are achieved using the method of surface tension control to reduce trapped gas bubbles of one embodiment.

The foregoing has described the principles, embodiments and modes of operation. However, the invention should not be construed as being limited to the particular embodiments discussed. The above described embodiments should be regarded as illustrative rather than restrictive, and it should be appreciated that variations may be made in those embodiments by workers skilled in the art without departing from the scope as defined by the following claims.

What is claimed is:

1. A method, comprising:
    forming a surface of a patterned imprint template having a first resist flow rate;
    forming a surface of a substrate having a second resist flow rate, wherein the first and second resist flow rates are differential flow rates selected to avoid trapping gas in a resist by pushing gas toward the imprint template for venting through the patterned recesses of imprint template;
    dispensing a resist onto the surface of the substrate;
    imprinting the resist with the imprint template while venting gas through the patterned recesses of the imprint template; and
    curing the resist to transfer a pattern from the imprint template to the resist, and
    wherein the patterned recesses of the imprint template form a pattern in the resist.

2. The method of claim 1, wherein the differential flow rates are selected such that the surface of the imprint template is more hydrophobic than the surface of the substrate.

3. The method of claim 2, wherein the resist forms a first contact angle with the surface of the imprint template and a second contact angle with the surface of the substrate while imprinting the resist, and wherein the first contact angle is greater than the second contact angle.

4. The method of claim 1, wherein the differential flow rates are selected such that the second resist flow rate is slower than the first resist flow rate.

5. The method of claim 4, wherein forming the surface of the imprint template comprises depositing a fluoroalkylsilane layer over the imprint template to form the surface of the imprint template.

6. The method of claim 5, wherein the fluoroalkylsilane is selected from a group consisting of 1H,1H,2H,2H-perfluorodecyltrichlorosilane; 1H,1H,2H,2H-perfluorooctyltrichlorosilane; and 1H,1H,2H,2H-perfluorooctyltriethoxysilane.

7. The method of claim 5, wherein forming the surface of the substrate comprises depositing an adhesion promoter layer over the substrate to form the surface of the substrate, and wherein the adhesion promoter layer facilitates adherence of the resist.

8. The method of claim 1, wherein the imprint template is a nanoimprint template for bit-patterned media.

9. The method of claim 1, wherein the imprint template is quartz and the gas is helium.

10. A method, comprising:
   depositing a first layer over an imprint template to form a surface of the imprint template having a first resist flow rate;
   depositing a second layer over a substrate to form a surface of the substrate having a second resist flow rate, wherein the first and second resist flow rates are differential flow rates selected to avoid trapping gas in a resist by pushing gas toward the imprint template for venting through patterned recesses of the imprint template; and
   imprinting a resist on the surface of the substrate with the imprint template while venting gas through the patterned recesses of the imprint template, and
   wherein the patterned recesses of the imprint template form a pattern in the resist.

11. The method of claim 10, wherein the differential flow rates are selected to facilitate filling the patterned recesses of the imprint template with the resist by capillary action.

12. The method of claim 10, wherein the differential flow rates are selected such that the surface of the imprint template is more hydrophobic than the surface of the substrate.

13. The method of claim 12, wherein the second layer comprises an adhesion promoter layer to facilitate adherence of the resist.

14. The method of claim 13, wherein the first layer comprises a fluoroalkylsilane, wherein the resist forms a first contact angle with the surface of the imprint template and a second contact angle with the surface of the substrate while imprinting the resist, and wherein the first contact angle is greater than the second contact angle.

15. The method of claim 14, wherein the fluoroalkylsilane selected from a group consisting of 1H,1H,2H,2H-perfluorodecyltrichlorosilane; 1H,1H,2H,2H-perfluorooctyltrichlorosilane; and 1H,1H,2H,2H-perfluorooctyltriethoxysilane.

16. A method, comprising:
   imprinting a resist on a surface of a substrate with an imprint template while venting gas through patterned recesses of the imprint template,
   wherein a surface of the imprint template has a first resist flow rate,
   wherein the surface of the substrate has a second resist flow rate,
   wherein the first and second resist flow rates are differential flow rates selected to avoid trapping the gas in the resist by pushing the gas toward the imprint template for venting through the patterned recesses of the imprint template, and
   wherein the patterned recesses of the imprint template form a pattern in the resist.

17. The method of claim 16, wherein the differential flow rates are selected to facilitate filling the patterned recesses of the imprint template with the resist by capillary action.

18. The method of claim 17, wherein the imprint template is a quartz nanoimprint template for bit-patterned media, and wherein the gas is helium.

19. The method of claim 18, wherein the imprint template has pores about 0.3 nm in diameter for venting the gas through the imprint template.

20. The method of claim 16, further comprising:
   depositing a fluoroalkylsilane layer over the imprint template to form the surface of the imprint template, and
   depositing an adhesion promoter layer over the substrate to form the surface of the substrate, wherein the differential flow rates are selected such that the fluoroalkylsilane layer is less wettable than the adhesion promoter layer.

* * * * *